(12) United States Patent
Betser et al.

(10) Patent No.: US 12,154,634 B2
(45) Date of Patent: Nov. 26, 2024

(54) DATA PATH CIRCUIT AND METHOD

(71) Applicant: Infineon Technologies LLC, San Jose, CA (US)

(72) Inventors: Yoram Betser, Haifa (IL); Alexander Kushnarenko, Haifa (IL)

(73) Assignee: Infineon Technologies LLC, San Jose, CA (US)

( * ) Notice: Subject to any disclaimer, the term of this patent is extended or adjusted under 35 U.S.C. 154(b) by 267 days.

(21) Appl. No.: 17/833,562

(22) Filed: Jun. 6, 2022

(65) Prior Publication Data

US 2023/0268010 A1    Aug. 24, 2023

Related U.S. Application Data

(60) Provisional application No. 63/311,596, filed on Feb. 18, 2022.

(51) Int. Cl.
*G11C 11/34* (2006.01)
*G11C 16/26* (2006.01)

(52) U.S. Cl.
CPC .................... *G11C 16/26* (2013.01)

(58) Field of Classification Search
CPC ..................................... G11C 16/26
USPC .................................... 365/185.18
See application file for complete search history.

(56) References Cited

U.S. PATENT DOCUMENTS

| | | | | |
|---|---|---|---|---|
| 6,496,415 B2* | 12/2002 | Tsao | ..................... | G11C 11/5628 365/185.11 |
| 6,981,100 B2* | 12/2005 | Ryan | .................... | G11C 7/1006 711/167 |
| 7,065,697 B2* | 6/2006 | Briggs | ................ | G06F 11/1028 714/767 |
| 7,327,766 B2* | 2/2008 | Stief | ................ | G11C 29/12015 370/537 |
| 7,362,135 B1* | 4/2008 | Chang | ................ | H03K 19/1774 326/47 |
| 7,535,772 B1* | 5/2009 | Parameswaran | ...... | G11C 7/1051 365/189.12 |
| 7,613,883 B2* | 11/2009 | Bellows | ................ | G11C 7/1012 711/167 |
| 7,644,216 B2* | 1/2010 | Fahr | ........................ | G06F 13/16 710/301 |
| 7,760,556 B2 | 7/2010 | Kang et al. | | |
| 7,836,213 B2* | 11/2010 | Vashisth | ............. | G06F 13/1652 710/312 |
| 8,151,173 B2* | 4/2012 | Hirose | ................. | G11C 7/1006 714/763 |

(Continued)

*Primary Examiner* — Viet Q Nguyen
(74) *Attorney, Agent, or Firm* — Slater Matsil, LLP

(57) ABSTRACT

In an embodiment, a memory circuit includes: a memory, N latch circuits coupled in parallel, a data multiplexer, a logic circuit, and a data path data path. The memory array is configured to provide read data to a first data bus, and each latch circuit is configured to store read data from the first data bus. The data multiplexer has N data inputs respectively coupled to data outputs of the N latch circuits and is configured to select a data input of the N data inputs of the data multiplexer to connect to the data output of the data multiplexer based on a selection input of the data multiplexer. The data path is configured to cause a propagation of data from a data output of the data multiplexer to a data input of the logic circuit.

21 Claims, 8 Drawing Sheets

(56) References Cited

U.S. PATENT DOCUMENTS

| | | | | |
|---|---|---|---|---|
| 8,432,769 | B2* | 4/2013 | Moon | G11C 7/1039 |
| | | | | 365/233.11 |
| 8,755,247 | B2* | 6/2014 | Ba | G11C 7/222 |
| | | | | 365/230.06 |
| 9,170,769 | B2* | 10/2015 | Mirchandani | H02J 50/05 |
| 9,224,480 | B2* | 12/2015 | Grant | G11C 16/06 |
| 9,324,411 | B2* | 4/2016 | Best | G11C 5/025 |
| 9,601,172 | B2* | 3/2017 | Lee | G11C 8/06 |
| 9,852,815 | B2* | 12/2017 | Lee | G11C 29/78 |
| 10,044,496 | B2* | 8/2018 | Mekhiel | H03K 5/15066 |
| 10,192,626 | B1* | 1/2019 | Bonitz | G11C 11/4125 |
| 10,740,263 | B2* | 8/2020 | Mirichigni | G11C 7/1063 |
| 11,054,992 | B2* | 7/2021 | Lee | G06F 3/0673 |
| 11,152,038 | B2* | 10/2021 | Kota | G11C 7/065 |
| 11,544,065 | B2* | 1/2023 | Nair | G06F 9/30138 |
| 2004/0143774 | A1 | 7/2004 | Jacobs | |
| 2006/0248305 | A1* | 11/2006 | Fang | G11C 7/22 |
| | | | | 711/167 |
| 2014/0210516 | A1 | 7/2014 | Hwang et al. | |
| 2014/0210526 | A1 | 7/2014 | Masleid et al. | |
| 2016/0013798 | A1 | 1/2016 | Sano | |
| 2020/0126601 | A1 | 4/2020 | Nobunaga et al. | |

* cited by examiner

DATA PATH CIRCUIT AND METHOD

CROSS-REFERENCE TO RELATED APPLICATIONS

This application claims the benefit of U.S. Provisional Application No. 63/311,596, entitled "Multi Channel Data_Mux for wide Frequency dynamic range," and filed on Feb. 18, 2022, which application is hereby incorporated herein by reference.

TECHNICAL FIELD

The present disclosure relates generally to an electronic system and method, and, in particular embodiments, to a data path circuit and method.

BACKGROUND

FIG. 1 shows a schematic diagram of exemplary memory circuit 100. Memory circuit 100 includes memory controller 102, read control circuit 104, memory array 106, latch control circuit 108, latch circuit 110, data path 112, and logic circuit 114. Conventional memory read operations are initiated by a read command and are executed synchronously. For example, FIG. 2 shows exemplary waveforms 200 associated with memory circuit 100 during a burst read operation. FIGS. 1 and 2 may be understood together.

When memory controller 102 receives a read command, a read operation to read data from memory array 106 and deliver such data at the output of logic circuit 114 is initiated. For example, as shown in FIG. 2, in response to receiving a first read command, signal RD_EN is pulsed, which causes signal RD_CR to initiate an analog data sensing process from data array 106 based on the decoded cell address from the received read command. After the analog data sensing process finishes, the sensed data is latched into latch circuit 110 in response to the assertion of signal RD_LAT. After the sensed data is latched into latch circuit 110, the sensed data becomes available as data $D_{110}$, and propagates through data path 112 to logic circuit 114. Data $D_{110}$ is captured (e.g., latched) into logic circuit 114 in response to the assertion of signal RDB_LATCH, and then provides such latched data to an external circuit as output data $D_{out}$.

Since the propagation delay of data path 112 may not be negligible, data $D_{110}$ is captured (e.g., latched into logic circuit 114 synchronously a fixed number of clock pulses after the read command is initiated, where the fixed number of clock pulses is sufficient to allow for the propagation delay of data path 112 when memory circuit 100 is operating at a maximum rated frequency. In the example shown in FIG. 2, signal RDB_LATCH is asserted 16 clock pulses after the beginning of the reception of the associated read command.

SUMMARY

In accordance with an embodiment, a memory circuit includes: a memory array configured to provide read data to a first data bus; N latch circuits coupled in parallel, where each latch circuit of the N latch circuits has data inputs coupled to the first data bus and is configured to store read data from the first data bus, and a latch input, where N is a positive integer greater than or equal to 2; a data multiplexer having a data output, N data inputs respectively coupled to data outputs of the N latch circuits, and a selection input, where the data multiplexer is configured to select a data input of the N data inputs of the data multiplexer to connect to the data output of the data multiplexer based on the selection input of the data multiplexer; a logic circuit having a data input and a data output; and a data path coupled between the data output of the data multiplexer and the data input of the logic circuit, the data path configured to cause a propagation of data from the data output of the data multiplexer to the data input of the logic circuit.

In accordance with an embodiment, a method includes: receiving a first read command; sensing first data from a memory array based on the first read command; providing the sensed first data to a first data bus; asserting a first latch signal a time after receiving the first read command; latching the sensed first data from the first data bus into one latch circuit of N latch circuits in response to the assertion of the first latch signal, where the N latch circuits are coupled in parallel, where each latch circuit of the N latch circuits has data inputs coupled to the first data bus, and where N is a positive integer greater than or equal to 2; causing an output of the one latch circuit to propagate to a data input of a logic circuit via a data path; asserting an output latch signal a first time after receiving the first read command to latch the sensed first data from the one latch circuit into the logic circuit; receiving a second read command; sensing second data from the memory array based on the second read command; selecting a next latch circuit from the N latch circuits; latching the sensed second data into the next latch circuit; causing an output of the next latch circuit to propagate to the data input of the logic circuit via the data path; and asserting the output latch signal a second time after receiving the second read command to latch the sensed second data from the next latch circuit into the logic circuit.

In accordance with an embodiment, a memory circuit includes: a memory array configured to provide read data to a first data bus; a controller configured to receive a read command and a clock signal and assert an output latch signal a predetermined number of clock pulses of the clock signal after reception of the read command, the controller further configured to provide a memory address to the memory array based on the read command; a read control circuit configured to, in response to the read command, assert a first read signal to cause the memory array to provide read data to the first data bus based on the memory address, and, a fixed time after asserting the first read signal, assert a first latch signal, where the fixed time is asynchronous with respect to the clock signal; N latch circuits coupled in parallel, where each latch circuit of the N latch circuits has data inputs coupled to the first data bus, and a latch input, where N is a positive integer greater than or equal to 2; a latch control circuit configured to receive the first latch signal from the read control circuit and provide a respective latching signal to the latch input of each latch circuit of the N latch circuits, where the latch control circuit is configured to cause the latching of data into one of the N latch circuits in response to the assertion of the first latch signal by asserting a respective output latch signals; a data multiplexer having a data output, N data inputs respectively coupled to data outputs of the N latch circuits, and a selection input, where the data multiplexer is configured to select a data input of the N data inputs of the data multiplexer to connect to the data output of the data multiplexer based on the selection input of the data multiplexer; a data path having a data input coupled to the data output of the data multiplexer; and a logic circuit having a data output, and a data input coupled to the data output of the data path, where the logic circuit is configured to latch data at the data input of the logic circuit when the output latch signal is asserted.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in specific contexts, e.g., a data path circuit with wide frequency range using a multi-channel data multiplexer (MUX), e.g., in a flash memory device, and an associated method for performing a read operation in the flash memory device. Embodiments of the present invention may be used in other types of memory devices, such as with other types of non-volatile memory devices and with volatile memory devices. Some embodiments may be used for data paths of other types of devices (e.g., micro-controllers, processors, etc.) that include internal memory, such as an internal data array. Some embodiments may be used for other types of operations, such as write operations.

In an embodiment of the present invention, a memory circuit includes a plurality of parallel latch circuits used to temporarily hold data read from a memory array prior to propagation of such data via a data path towards an output terminal of the memory circuit. The latch circuits are updated in a round robin manner with data read from the memory array. A MUX selects which of the latch circuits provides the output to the data path in a round robin manner. By using parallel latch circuits to temporarily hold the data, some embodiments advantageously achieve a lower minimum operating frequency without affecting the delay between the output of the memory array and the output terminal of the memory circuit, thereby advantageously achieving a wider operating frequency range without affecting the maximum operating frequency of the memory array.

Figure 1:
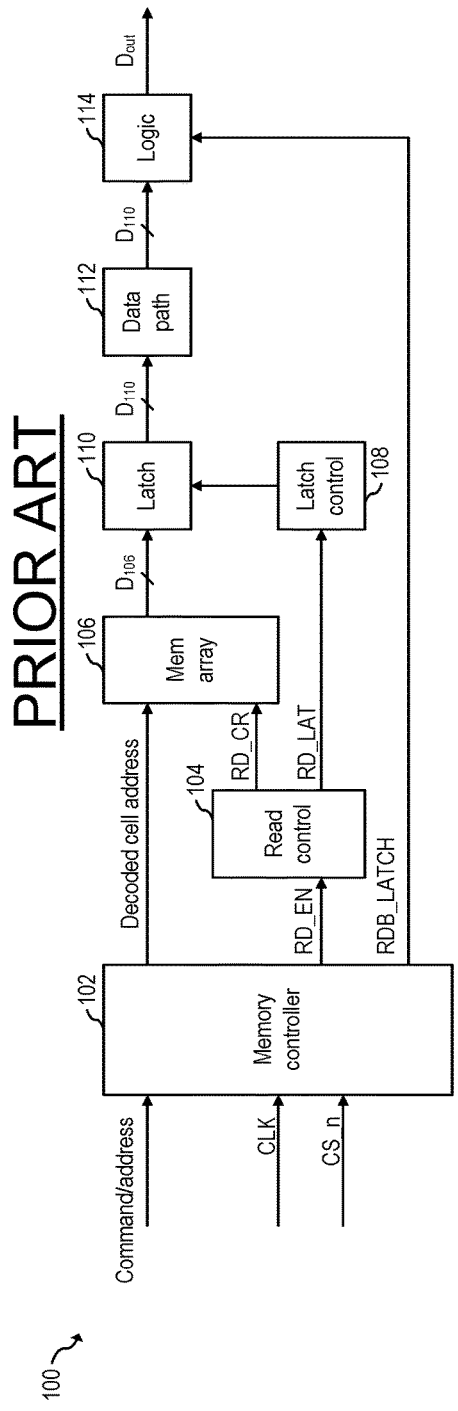
FIG. 1 shows a schematic diagram of an exemplary memory circuit.
Figure 2:
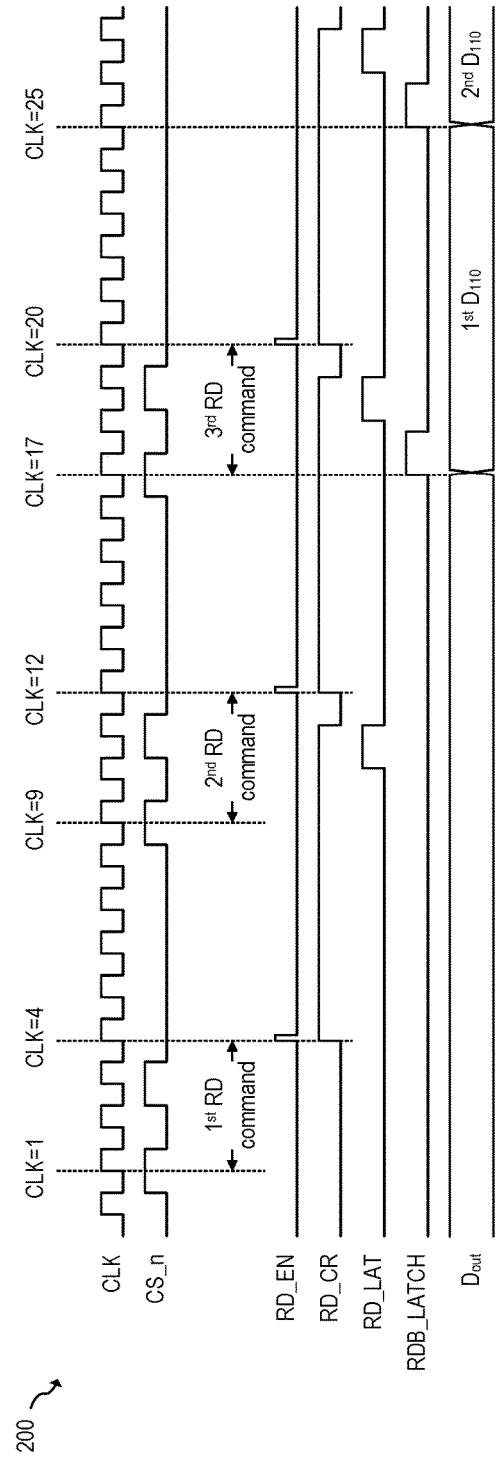
FIG. 2 shows exemplary waveforms associated with the memory circuit of FIG. 1.
Figure 3:
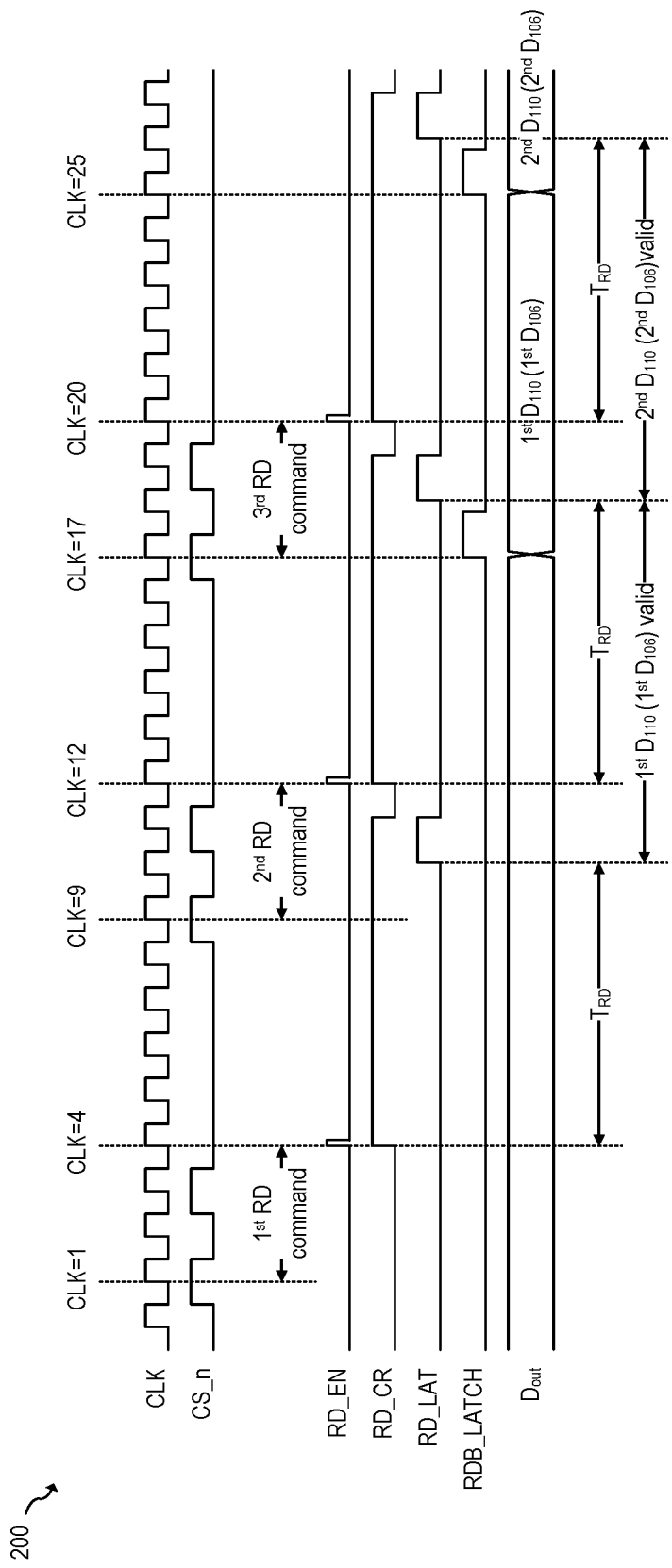
FIG. 3 shows exemplary waveforms associated with the memory circuit of FIG. 1.

FIG. 3 shows exemplary waveforms 200 with additional labels. As shown in FIG. 3, during a burst read operation, read commands are received periodically (e.g., every 8 clock pulses). Time $T_{RD}$ from the assertion of signal RD_CR to the assertion of signal RD_LAT is based on the sense time for sense amplifiers (not shown) associated to sense or read data from memory array 106 and produce corresponding data $D_{106}$. For example, read control 108 may assert signal RD_LAT a fixed time $T_{RD}$ after the assertion of signal RD_CR, where the fixed time $T_{RD}$ is sufficiently long so as to allow for the analog data sensing process to produce data $D_{106}$ from the memory array 106 based on the received read command.

Given the sequential reception of read commands during a burst read operation, the content of latch circuit 110 is periodically updated in response to the periodic assertion of signal RD_LAT. Thus, as shown in FIG. 3, memory controller 102 asserts signal RDB_LATCH a fixed number of clock pulses (e.g., 16) after the beginning of the reception of the associated read command, where the fixed number of pulses is designed to occur during the period in which the data $D_{110}$ associated with the corresponding read command is still valid. For example, as shown in FIG. 3, signal RDB_LATCH is first asserted during clock pulse 17 (which occurs prior to signal RD_LAT being asserted in response to the reception of a second read command), which causes the correct capture of data $D_{110}$ associated with the first read command (received between clock pulses 1 and 4).

As shown in FIG. 3, during a burst read operation, output data $D_{out}$ correctly produces data $1^{st}$ $D_{110}$ associated with $1^{st}$ RD command, data $2^{nd}$ $D_{110}$ associated with $2^{nd}$ RD command, and so on.

Reducing the frequency of clock signal CLK of memory circuit 100 may cause output data $D_{out}$ to be corrupted. For example, FIG. 4 shows exemplary waveforms 400 at a clock frequency lower than waveforms 200.

Figure 4:
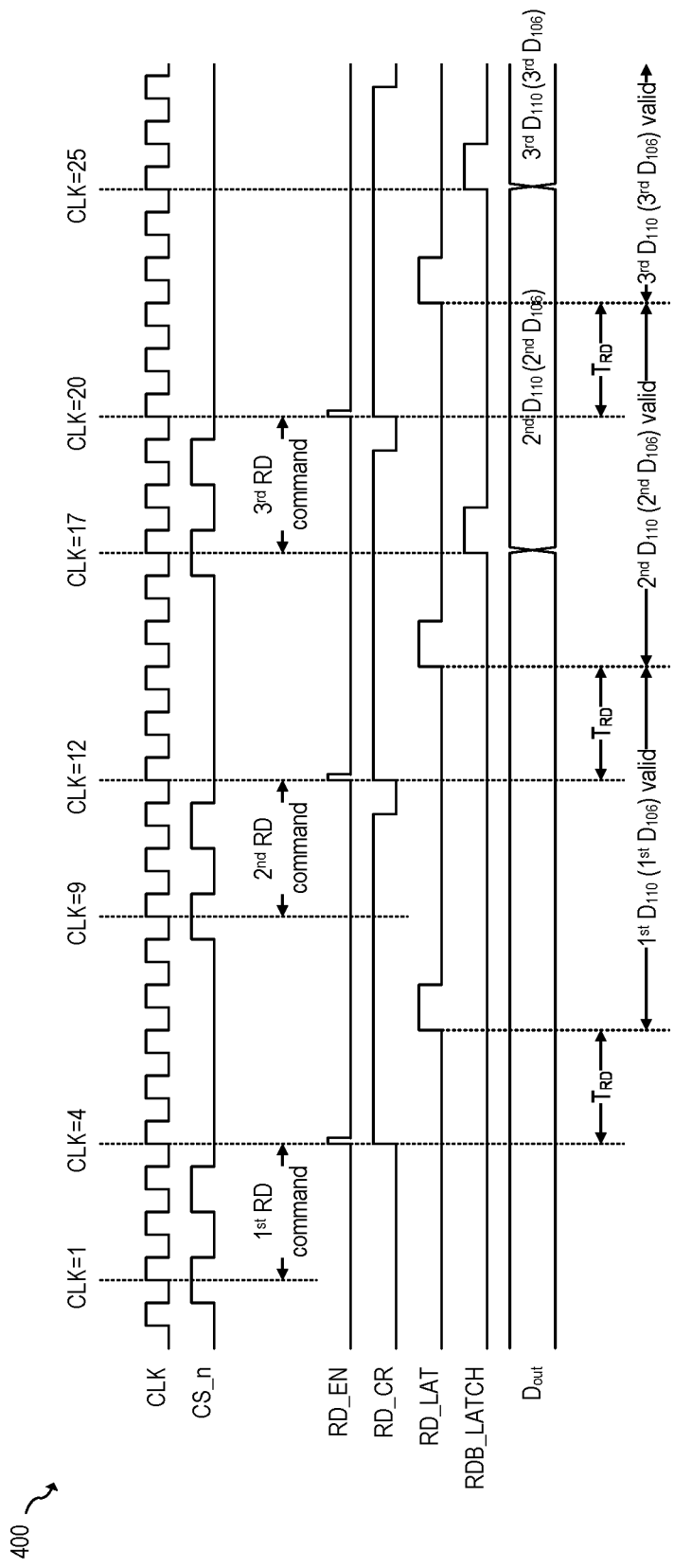
FIG. 4 shows exemplary waveforms associated with the memory circuit of FIG. 1 at a clock frequency lower than the waveforms of FIG. 3.

As shown in FIG. 4, since clock signal CLK has a lower frequency than in waveforms 400 than in waveforms 200, and since time $T_{RD}$ is fixed, the first assertion of signal RD_LAT in waveforms 400 occurs asynchronously between clock pulses 6 and 7, as opposed to occurring asynchronously around clock pulse 10 in waveforms 200. The same behavior occurs each time signal RD_LAT is asserted.

Since the assertion of signal RDB_LATCH occurs at fix clock pulse intervals (clock pulse 17 in the examples of waveforms 200 and 400), the first assertion of signal RDB_LATCH intending to capture data $1^{st}$ $D_{110}$ occurs when data $1^{st}$ $D_{110}$ is no longer available and the wrong data ($2^{nd}$ $D_{110}$, associated with the second RD command) is latched into logic circuit 114. As a result, output data $D_{out}$ is corrupted as it does not include data $1^{st}$ $D_{110}$ associated with the $1^{st}$ RD command.

As illustrated in FIGS. 3 and 4, memory circuit 100 has a relatively narrow operating frequency range for producing uncorrupted output data $D_{out}$.

In an embodiment of the present invention, a memory circuit achieves a wide operating frequency by using a plurality of parallel latch circuits to temporarily hold data read from a memory array prior to propagation of such data via the data path. The latch circuits are updated in a round robin manner with data read from the memory array. A MUX selects which of the latch circuits provides the output to the data path in a round robin manner. The MUX is updated to output data from the next latch circuit when signal RDB_LATCH is asserted or after, which advantageously causes data at output $D_{OUT}$ to be delivered in the same order in which the data was read.

Figure 5:
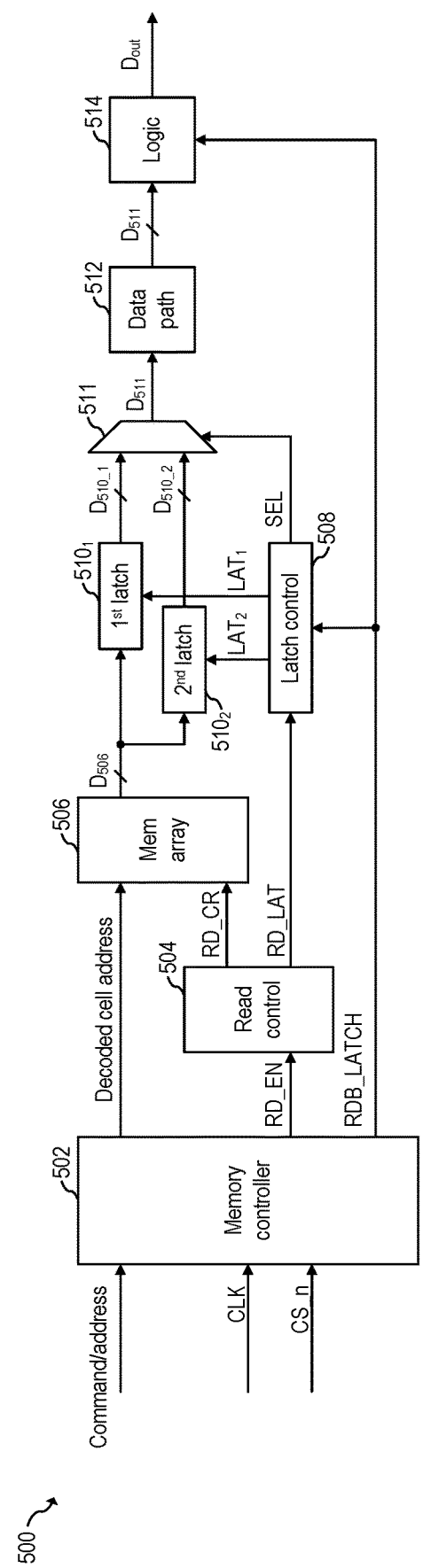
FIG. 5 shows a schematic diagram of a memory circuit, according to an embodiment of the present invention.

FIG. 5 shows a schematic diagram of memory circuit 500, according to an embodiment of the present invention. Memory circuit 500 includes memory controller 502, read control circuit 504, memory array 506, latch control circuit 508, latch circuits 510, MUX 511, data path 512, and logic circuit 514.

In some embodiments, memory circuit 500 is, e.g., a flash memory circuit, such as a NAND flash memory circuit or a NOR flash memory circuit. In some embodiments, memory circuit 500 may be implemented with other non-volatile memory technologies. In some embodiments, memory circuit 500 may be a volatile memory circuit.

In some embodiments, memory circuit 500 is implemented in a single IC, which may include a single die or a plurality of dies. In some embodiments, memory circuit 500 may be implemented using a plurality of ICs.

In some embodiments, memory circuit 500 is designed to operate with a wide frequency range. For example, in some embodiments, the operating frequency of clock signal CLK may range from 533 MHz to 800 MHz. Other frequency ranges such as maximum operating frequencies higher than 800 MHZ (e.g., 820 MHz, goo MHz, 2 GHz or higher), or lower than 800 MHz (e.g., 600 MHz, 50 MHz or lower), and minimum operating frequencies higher than 533 MHz (e.g., 600 MHz, 1 GHz, or higher) or lower than 533 MHz (e.g., 200 MHz, 10 MHz, or lower), may also be used.

In some embodiments, memory circuits 500 includes a plurality of modes for different frequency ranges. For examples, in a first mode, the clock signal CLK may range from 0 MHz to 266 MHz, in a second mode, the clock signal CLK may range from 266 MHz to 533 MHz, in a third mode, the clock signal CLK may range from 533 MHz to 800 MHz, and in a fourth mode, the clock signal CLK may range from 533 MHz to 820 MHz. As another example, in some embodiment, in a first mode, the clock signal CLK may range from 800 MHz to 1066 MHz, in a second mode, the clock signal CLK may range from 1066 MHz to 1333 MHz, and in a third mode, the clock signal CLK may range from 1333 MHz to 1600 MHz. Other implementations are also possible.

In some embodiments, memory controller 502 is configured to cause the performance of memory operations (e.g., read, write) onto memory array 506 based on commands received, e.g., from an external circuit. For example, in some embodiments, memory controller 502 receives a read command (e.g., from an external controller) and, in response, reads the requested data from memory array 506 and provides the requested data as output $D_{out}$ (e.g., to the external controller).

In some embodiments, memory controller 502 is compatible and operates in accordance with known communication protocols, such as serial peripheral interface (SPI) and low power double data rate 4 (LPDDR4). In some embodiments, memory controller 502 does not comply and/or is not compatible with known communication protocols.

In some embodiments, memory controller 502 includes an address control circuit (not shown) configured to produce a decoded memory cell address based on a received read command.

In some embodiments, memory control 502 may be implemented as a generic or custom controller or processor coupled to a memory and configured to execute instructions from the memory. In some embodiments, memory controller 502 may include a finite state machine (FSM). Other implementations are also possible.

In some embodiments, memory array 506 is configured to store data. In some embodiments, memory array 506 may be implemented with flash memory, such as with NOR flash or NAND flash, for example. Other implementations, such as using non-flash memories, such as using volatile memories, are also possible.

In some embodiments, sense amplifiers or sense circuitry (not shown) associated with memory array 506 are used to sense the state of the memory cells of memory array 506 and provide such states as data to data bus 506. In one embodiment, sense circuitry may be a part of memory array 506. In some embodiments, a plurality of latches (not shown), the outputs of which are the data bus 506, may be used at the output of the sense amplifiers to temporarily store the sensed data, which may advantageously allow for the multiplexing of the sense amplifier to sense data In some embodiments, data bus 506 is a parallel bus that includes dozens or hundreds of lines, such more than 100 data lines, such as 300 data lines.

In some embodiments, read control circuit 504 is configured to trigger a read operation for reading data from memory array 506. For example, in some embodiments, read control circuit 504 asserts signal RD_CR (e.g., in response to signal RD_EN asserting or pulsing). The assertion of signal RD_CR causes memory array to begin a read operation (e.g., using sense amplifiers and in a known manner) to read memory cells corresponds to the decoded memory cell address received from memory controller 502. After a (e.g., predetermined and fixed) time (e.g., $T_{RD}$), read control circuit 504 asserts signal RD_LAT to cause the latching of the sensed data $D_{506}$ into one of the latches 510 using latch control circuit 508.

In some embodiments, read control circuit 504 includes digital circuits and may be implemented using an FSM. Other implementations are also possible. In some embodiments, read control circuit 504 is implemented as part of memory controller 502.

In some embodiments, latches 510 are configured to store data from data bus 506 in response to the assertion of signal RD_LAT. As shown in FIG. 5, in some embodiments, latches 510 include 2 latches $510_1$ and $510_2$. As will be described in more detail below, in some embodiments, latches 510 may include more than 2 latches, such as n latches, where n is an integer greater than 2, such as 3, 5, 10, or more.

In some embodiments, latch control circuit 508 is configured to select which of the latches 510 (e.g., $510_1$ or $510_2$) captures the data from data bus 506 in response to the assertion of signal RD_LAT by using signals $LAT_1$ and $LAT_2$. In some embodiments, latch control circuit 508 also selects which of the latches 510 is propagated into data bus $D_{511}$ using signal SEL.

In some embodiments, latch control circuit 508 is implemented using digital circuits, such as combinatorial logic.

In some embodiments, MUX 511 is configured to select which data is transferred to data path 512 based on signal SEL. MUX 511 may be implemented in any way known in the art.

In some embodiments, data path 512 includes circuits, such as buffer circuits, to route data from the output of MUX 511 (which may be physically located near memory array 506) to logic circuit 514 (which may be physically located near the output, such as I/O pins, of memory circuit 500). Data path 512 may be implemented in any way known in the art.

In some embodiments, memory circuit 500 includes a plurality of memory arrays 506, e.g., implemented in respective memory banks, where the bank selection may be controlled with bank address bus (e.g., of a read command). In some such embodiments, data path 512 may receive data from the plurality of memory banks (e.g., via respective MUXes 511).

In some embodiments, logic circuit 514 is configured to capture data from data bus $D_{511}$ in response to the assertion of signal RDB_LATCH, and provide such captured data as output $D_{out}$. In some embodiments, logic circuit 514 is implemented using digital circuits, such as combinatorial logic.

Figure 6:
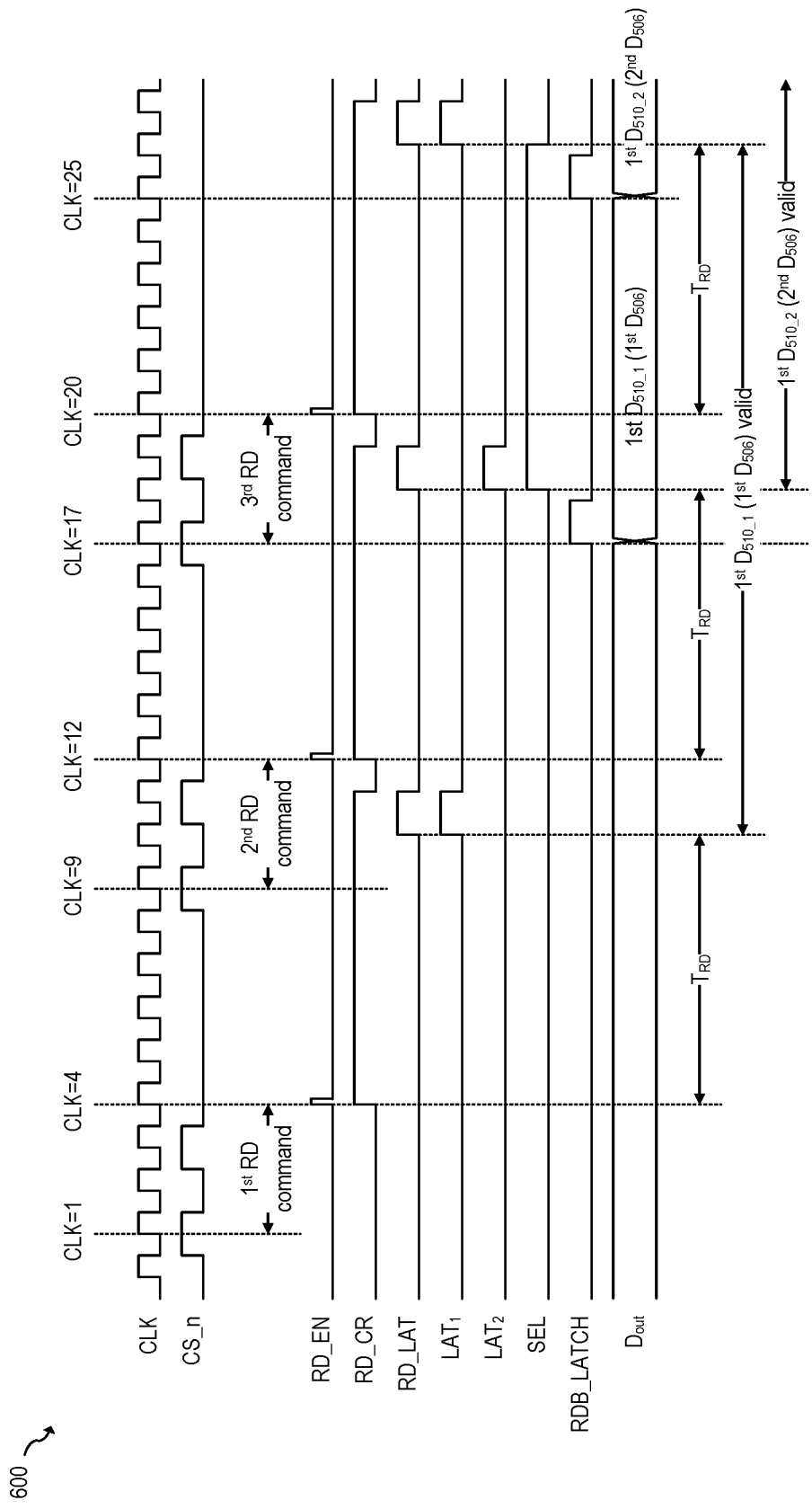
FIGS. 6 and 7 show waveforms associated with the memory circuit of FIG. 5 during a burst read operation, according to an embodiment of the present invention.
Figure 7:
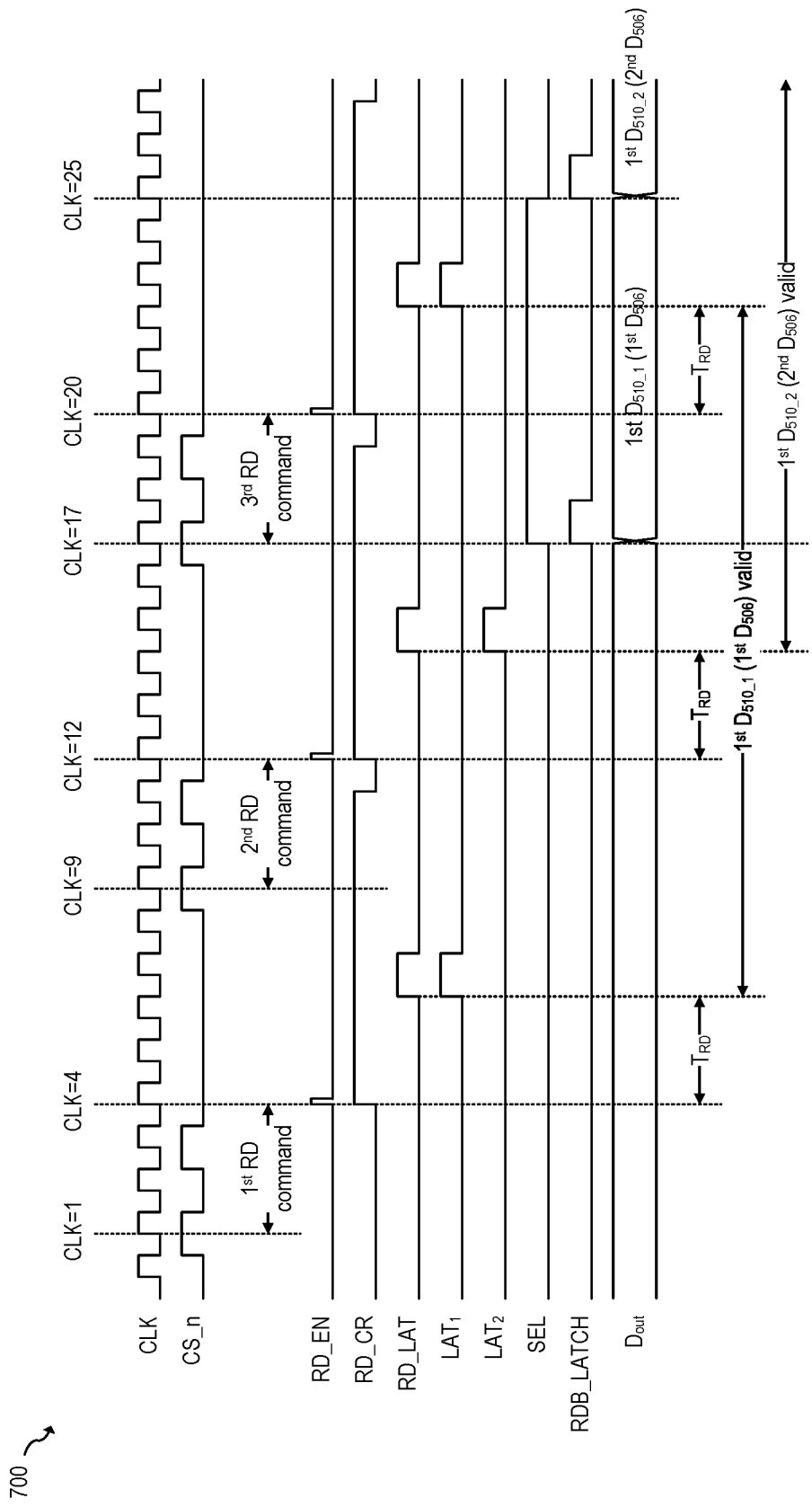

FIGS. 6 and 7 show waveforms 600 and 700, respectively, associated with memory circuit 500 during a burst read operation, according to an embodiment of the present invention. Waveforms 600 have the same clock frequency as waveforms 200. Waveforms 700 have the same clock frequency as waveforms 400. FIGS. 5-7 may be understood together.

When memory controller 502 receives a read command, memory controller 502 provides decoded cell address (based on the received read command) to memory array 506, and triggers a data read from memory array 506 by asserting signal RD_EN. Read control circuit 504 asserts signal RD_CR in response to the pulsing of signal RD_EN and starts an internal timer (not shown) designed to assert signal RD_LAT after time $T_{RD}$.

In response to the assertion of signal RD_CR, data is read in a conventional manner from memory cells of memory array 506 at an address based on the decoded cell address provided by memory controller 502 using sense amplifiers (not shown). The read data is provided to data bus $D_{506}$ when the data sensing process (performed by the sense amplifiers) finishes.

Read control circuit 504 asserts signal RD_LAT at the expiration of the internal timer, which occurs time $T_{RD}$ after the assertion of signal RD_CR. In some embodiments, time $T_{RD}$ is sufficient to allow for the data sensing process to finish. As shown in FIGS. 6 and 7, in some embodiments, time $T_{RD}$ is independent to the clock signal CLK. For example, at a first (faster) clock frequency of clock signal CLK, the assertion of signal RD_LAT occurs about 7 clock pulses after the assertion of signal RD_CR, as shown in FIG. 6. At a second (slower) clock frequency of clock signal CLK, the assertion of signal RD_LAT occurs about 3 clock pulses after the assertion of signal RD_CR.

In response to signal RD_LAT being asserted by read control circuit 504 at the expiration of the internal timer, latch control circuit 508 asserts one of signals $LAT_1$ or $LAT_2$ to cause the data at data bus $D_{506}$ to be latched in one of latches $510_1$ or $510_2$. For example, as shown in FIGS. 6 and 7, in response to the assertion of signal RD_LAT, latch control circuit 508 asserts signal $LAT_1$ to cause the latching into latch $510_1$ of the data $D_{506}$ corresponding to an odd read command ($1^{st}$ RD command, $3^{rd}$ RD command, etc.) and asserts signal $LAT_2$ to cause the latching into latch $510_2$ of the data $D_{506}$ corresponding to an even read command ($2^{nd}$ RD command, $4^{th}$ RD command, etc.).

As shown in FIGS. 6 and 7, latch control circuit 508 also transitions signal SEL (e.g., in a round robin manner), e.g., at or after the assertion of signal RDB_LATCH to cause the propagation of the read data (e.g., in the same sequential order in which data is latched from data bus $D_{506}$) from latches 510 to data bus $D_{511}$.

After a fixed number of clock pulses from the assertion of signal RD_EN (e.g., 13 clock pulses after signal RD_EN is asserted, as shown in FIGS. 6 and 7), memory controller 502 asserts signal RDB_LATCH to cause logic circuit 514 to latch the data from data bus $D_{511}$. In some embodiments, the fixed number of clock pulses (e.g., 13 in the embodiments of FIGS. 6 and 7) from the assertion of signal RD_EN to the assertion of signal RDB_LATCH is designed to allow sufficient time for data to propagate from the output of memory array 506 through data path 512 to logic circuit 514.

As illustrated in FIGS. 5-7, some embodiments are advantageously capable of operating at low operating frequencies while avoiding corruption of output data $D_{out}$. For example, in the examples of FIGS. 6 and 7, in response to the reception of a first read command ($1^{st}$ RD), first data ($1^{st}$ $D_{506}$) is sensed from memory array 506 and is provided to data bus $D_{506}$. The assertion of latch signal RD_LAT causes the assertion of latching signal $LAT_1$, which causes the latching of the first data $1^{st}$ $D_{506}$ into latch $510_1$. When signal SEL is low, the output of latch $510_1$ flows through MUX 511 and through data path 512. When output latch signal RDB_LATCH is asserted, the first data $1^{st}$ $D_{506}$ from latch $510_1$ is latched into logic circuit 514. In response to the reception of a second read command ($2^{nd}$ RD), second data ($2^{nd}$ $D_{506}$) is sensed from memory array 506 and is provided to data bus $D_{506}$. The subsequent assertion of latch signal RD_LAT causes the assertion of latching signal $LAT_2$, which causes the latching of the second data $2^{nd}$ $D_{506}$ into latch $510_2$. When signal SEL is high, the output of latch $510_2$ flows through MUX 511 and through data path 512. When output latch signal RDB_LATCH is subsequently asserted, the second data $2^{nd}$ $D_{506}$ from latch $510_2$ is latched into logic circuit 514.

As illustrated in FIGS. 6 and 7, by using a plurality of parallel latches (e.g., 510) that are selectively latched asynchronously with data from a memory array (e.g., 506), some embodiments advantageously achieve a lower minimum operating frequency without affecting the maximum operating frequency, thereby exhibiting a wider operating frequency range compared with a solution relying on a plurality of serial latches such as implemented in a conventional FIFO buffer.

In some embodiments, such as shown in FIG. 5, two parallel latches ($510_1$ and $510_2$) are used, where the addition of the second latch cause the minimum operating frequency of memory circuit 500 to half (thus doubling the operating frequency range of memory circuit 500). In some embodiments, more than two parallel latches may be used to lower the minimum operating frequency further. For example, FIG. 8 shows a schematic diagram of memory circuit 800, according to an embodiment of the present invention.

Figure 8:
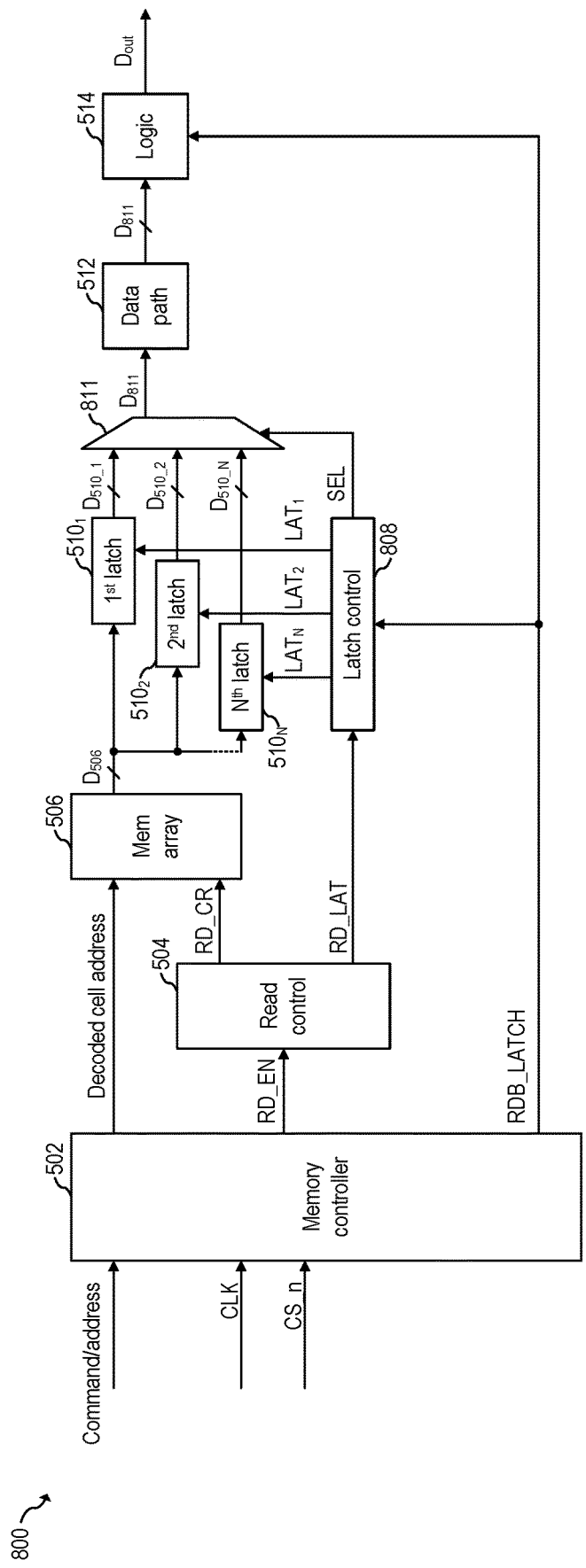
FIG. 8 shows a schematic diagram of a memory circuit, according to an embodiment of the present invention.

As shown in FIG. 8, memory circuit 800 includes N latches 510, where N is a positive integer greater than or equal to 2. Memory circuit 500 is a possible implementation of memory circuit 800 with N equal to 2.

In some embodiments, when N is equal to 2, memory circuit 800 operates as memory circuit 500, with MUX 811 operating as MUX 511, and latch control circuit 808 operating as latch control circuit 508.

More generally (when N is equal to or greater than 2), latch control circuit 808 is configured to assert one of signals $LAT_1$ to $LAT_N$ to cause the data at data bus $D_{506}$ to be latched in one of latches $510_1$ to $510_N$. For example, in some embodiments, in response to the assertion of signal RD_LAT, latch control circuit 808 asserts one of signals $LAT_1$ to $LAT_N$ (e.g., selected in a round robin manner) to cause the latching of the data $D_{506}$ into the corresponding latch $510_1$.

Latch control circuit 808 also transitions signal SEL (e.g., in a round robin manner), e.g., at or after the assertion of signal RDB_LATCH to cause the propagation of the read data (e.g., in the same sequential order in which data is latched from data bus $D_{506}$) from latches 510 to data bus $D_{811}$. For example, in some embodiments, latch control circuit 808 transitions signal SEL to select the next latch $510_i$ according to the latest event between the assertion of signal RDB_LATCH and the assertion of the signal $LAT_i$, where i is a number between 1 and N (where i=1 corresponds to latch $510_1$, i=2 corresponds to latch $510_2$, and i=N corresponds to latch $510_N$). In some embodiments, i may be increment sequentially in a round robin manner.

For example, when signal SEL is equal to 0 (selecting the output of latch circuit $510_1$), the next latch circuit to be selected is $510_2$ and i is equal to 2. Thus, in some embodiments, the transition of signal SEL from 0 to 1, occurs according to the latest event between the assertion of RDB_LATCH and the assertion of signal $LAT_2$, as illustrated in FIGS. 6 and 7. When signal SEL is equal to N−1 (selecting the output of latch circuit $510_N$), the next latch circuit to be selected is $510_1$ and i is equal to 1. Thus, in some embodiments, the transition of signal SEL from N−1 to 0, occurs according to the latest event between the assertion of RDB_LATCH and the assertion of signal $LAT_1$.

For example, in some embodiments, signal SEL may be updated according to the following:
when SEL=0, SEL transitions to 1 at the latest assertion between RDB_LATCH or $LAT_1$;
when SEL=1, SEL transitions to 2 at the latest assertion between RDB_LATCH or $LAT_2$.
when SEL=N−1, SEL transitions to 0 at the latest assertion between RDB_LATCH or $LAT_N$.

Thus, when N=2, in some embodiments, signal SEL may be updated according to the following:
when SEL=0, SEL transitions to 1 at the latest assertion between RDB_LATCH or $LAT_1$;
when SEL=1, SEL transitions to 0 at the latest assertion between RDB_LATCH or $LAT_2$, where signals $LAT_1$ and $LAT_2$ are asserted in an alternate manner in response to the assertion of signal RD_LAT.

Figure 9:
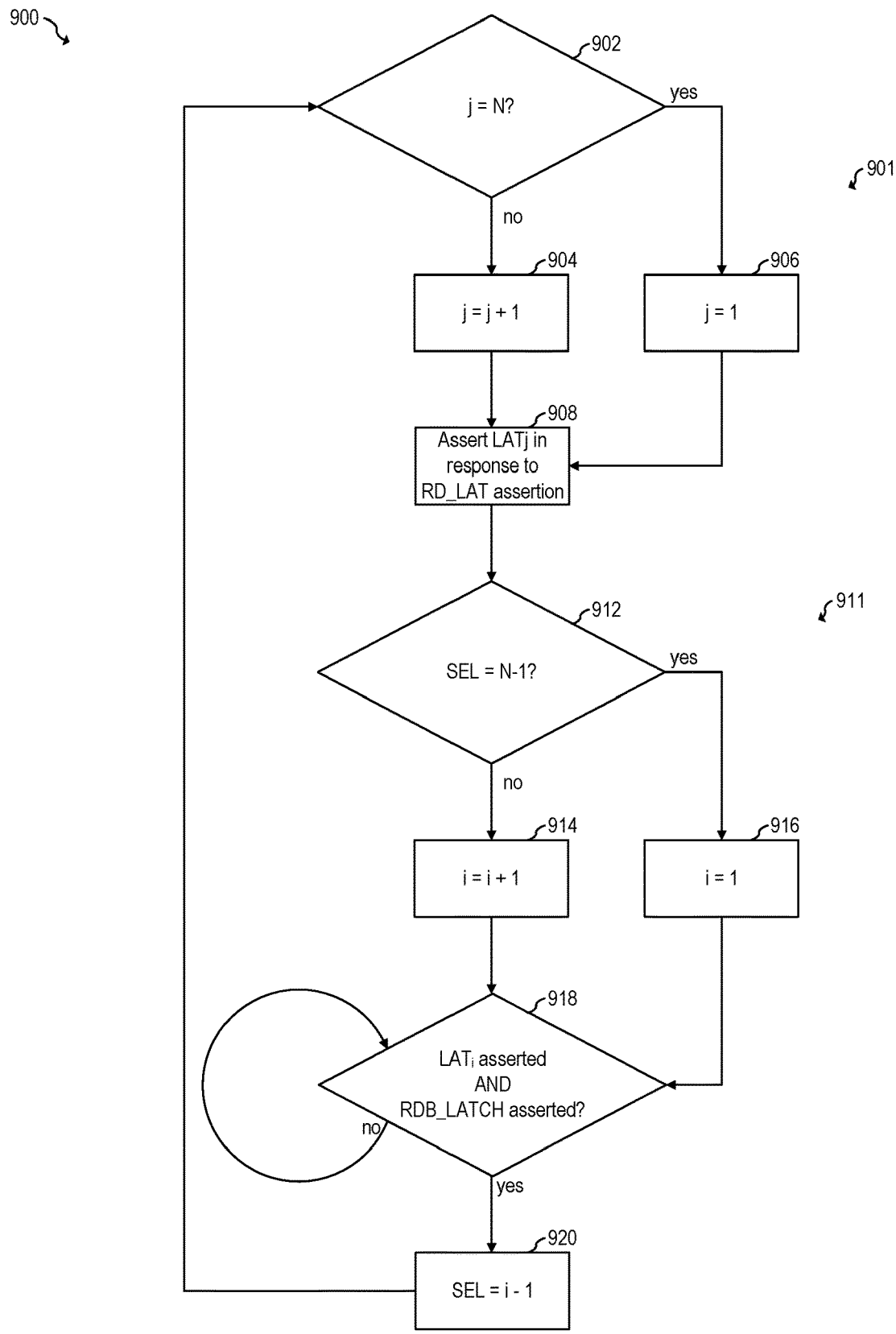
FIG. 9 shows a flow chart of an embodiment method for controlling latch circuits and associated data multiplexer (MUX), according to an embodiment of the present invention.

FIG. 9 shows a flow chart of embodiment method goo for controlling latch circuits 510 and MUX 811, according to an embodiment of the present invention. Method 900 includes steps 901 and 911. Step 901 is performed for determining which signal $LAT_j$ to assert in response to the assertion of signal RD_LAT and includes steps 902, 904, 906, and 908. Step 911 is performed for determining when to update signal SEL and includes steps 912, 914, 916, 918 and 920. Method 900 may be implemented by latch control 808.

As shown by steps 902, 904, and 906, j is updated in a round robin manner, and signal $LAT_j$ is asserted (in a round robin manner), e.g., $T_{RD}$ time after assertion of signal RD_CR, during step 908.

As shown by steps 912, 914, and 916, i is updated in a round robin manner, and signal SEL is updated (in a round robin manner) during step 920 when signal $LAT_i$ and RDB_LATCH have both been asserted in the current round robin cycle, as determined during step 918.

By updating signal SEL at the latest event between the assertion of signal LATi and RDB_LATCH, some embodiments advantageously reduce power consumption and noise that may result from transitioning signal SEL before signal LATi has transitioned. However, in some embodiments, step 918 may be modified to output yes when signal RDB_LATCH is asserted (e.g., without regard as to the status of signal $LAT_i$), which may advantageously result in a simpler implementation.

In some embodiments, using a multi-channel data MUX (e.g., 511, 811) advantageously enables the usage of asynchronous data path in memory systems with wide dynamic frequency ranges, where the number of channels of the multi-channel data MUX may not be limited and may be determined the memory system requirements. Additional advantages of some embodiments include the achievement of wide operating frequency range with a low power design that has low design complexity and low silicon area. In some embodiments, design of a memory circuit (e.g., 500, 800) may be easily migrated between different manufacturing technologies.

Example embodiments of the present invention are summarized here. Other embodiments can also be understood from the entirety of the specification and the claims filed herein.

Example 1. A memory circuit including: a memory array configured to provide read data to a first data bus; N latch circuits coupled in parallel, where each latch circuit of the N latch circuits has data inputs coupled to the first data bus and is configured to store read data from the first data bus, and a latch input, where N is a positive integer greater than or equal to 2; a data multiplexer having a data output, N data inputs respectively coupled to data outputs of the N latch circuits, and a selection input, where the data multiplexer is configured to select a data input of the N data inputs of the data multiplexer to connect to the data output of the data multiplexer based on the selection input of the data multiplexer; a logic circuit having a data input and a data output; and a data path coupled between the data output of the data multiplexer and the data input of the logic circuit, the data path configured to cause a propagation of data from the data output of the data multiplexer to the data input of the logic circuit.

Example 2. The memory circuit of example 1, further including: a read control circuit configured to, in response to a read command, assert a first read signal to cause the memory array to provide the read data to the first data bus, and after asserting the first read signal, assert a first latch signal; and a latch control circuit configured to provide a selection signal to the selection input of the data multiplexer, receive the first latch signal from the read control circuit, and provide a respective latching signal to the latch input of each latch circuit of the N latch circuits, where the latch control circuit is configured to assert one of the latching signals in response to the assertion of the first latch signal.

Example 3. The memory circuit of one of examples 1 or 2, further including a controller configured to receive the read command and assert an output latch signal a time after reception of the read command, where the logic circuit is configured to latch data at the data input of the logic circuit when the output latch signal is asserted.

Example 4. The memory circuit of one of examples 1 to 3, where the controller is configured to assert a read enable signal in response to receiving the read command, where the read control circuit is configured to assert the first read signal in response to the assertion of the read enable signal.

Example 5. The memory circuit of one of examples 1 to 4, where the controller is configured to receive a clock signal, where the read command is synchronized with the clock signal, and where the controller is configured to assert the output latch signal a fixed number of clock pulses of the clock signal after reception of the read command.

Example 6. The memory circuit of one of examples 1 to 5, where the latch control circuit is configured to control the selection signal based on the output latch signal.

Example 7. The memory circuit of one of examples 1 to 6, where the latch control circuit is configured to cause a transition of the selection signal in a round robin manner when the output latch signal is asserted.

Example 8. The memory circuit of one of examples 1 to 7, where the latch control circuit is configured to cause a transition of the selection signal to a next value selecting a next latch circuit of the N latch circuits a latest event between the assertion of the output latch signal and the assertion of the latching signal provided to the next latch circuit.

Example 9. The memory circuit of one of examples 1 to 8, where N is equal to 2 so that the N latch circuits includes first and second latch circuits, and where the latch control circuit is configured to alternate between asserting a first latching signal provided to the first latch circuit and asserting a second latching signal provided to the second latch circuit, in response to the assertion of the first latch signal.

Example 10. The memory circuit of one of examples 1 to 9, where the read control circuit is configured to assert the first latch signal a fixed time after asserting the first read signal.

Example 11. The memory circuit of one of examples 1 to 8 or 10, where N is equal to 4 so that the N latch circuits includes first, second, third, and fourth latch circuits, and where the latch control circuit is configured to assert first, second, third, and fourth latching signals provided to the first, second, third, and fourth latch circuits, respectively, in a round robin manner, in response to assertions of the first latch signal.

Example 12. The memory circuit of one of examples 1 to 11, where the memory array includes flash memory.

Example 13. The memory circuit of one of examples 1 to 12, where the first data bus includes more than 100 data lines.

Example 14. A method including: receiving a first read command; sensing first data from a memory array based on the first read command; providing the sensed first data to a first data bus; asserting a first latch signal a time after receiving the first read command; latching the sensed first data from the first data bus into one latch circuit of N latch circuits in response to the assertion of the first latch signal, where the N latch circuits are coupled in parallel, where each latch circuit of the N latch circuits has data inputs coupled to the first data bus, and where N is a positive integer greater than or equal to 2; causing an output of the one latch circuit to propagate to a data input of a logic circuit via a data path; asserting an output latch signal a first time after receiving the first read command to latch the sensed first data from the one latch circuit into the logic circuit; receiving a second read command; sensing second data from the memory array based on the second read command; selecting a next latch circuit from the N latch circuits; latching the sensed second data into the next latch circuit; causing an output of the next latch circuit to propagate to the data input of the logic circuit via the data path; and asserting the output latch signal a second time after receiving the second read command to latch the sensed second data from the next latch circuit into the logic circuit.

Example 15. The method of example 14, where selecting the next latch circuit from the N latch circuits includes selecting the next latch circuit in a round robin manner.

Example 16. The method of one of examples 14 or 15, further including receiving a clock signal, where the first read command is synchronized with the clock signal, where asserting the output latch signal includes asserting the output latch signal a fixed number of clock pulses of the clock signal after receiving the first read command.

Example 17. The method of one of examples 14 to 16, where a frequency of the clock signal is between 533 MHz to 820 MHz.

Example 18. The method of one of examples 14 to 17, where selecting the next latch circuit from the N latch circuits includes selecting the next latch circuit in response to the latest event between the assertion of the output latch signal and the latching of the sensed second data into the next latch circuit.

Example 19. The method of one of examples 14 to 18, where asserting the first latch signal includes asserting the first latch signal a fixed time after receiving the first read command.

Example 20. A memory circuit including: a memory array configured to provide read data to a first data bus; a controller configured to receive a read command and a clock signal and assert an output latch signal a predetermined number of clock pulses of the clock signal after reception of the read command, the controller further configured to provide a memory address to the memory array based on the read command; a read control circuit configured to, in response to the read command, assert a first read signal to cause the memory array to provide read data to the first data bus based on the memory address, and, a fixed time after asserting the first read signal, assert a first latch signal, where the fixed time is asynchronous with respect to the clock signal; N latch circuits coupled in parallel, where each latch circuit of the N latch circuits has data inputs coupled to the first data bus, and a latch input, where N is a positive integer greater than or equal to 2; a latch control circuit configured to receive the first latch signal from the read control circuit and provide a respective latching signal to the latch input of each latch circuit of the N latch circuits, where the latch control circuit is configured to cause the latching of data into one of the N latch circuits in response to the assertion of the first latch signal by asserting a respective output latch signals; a data multiplexer having a data output, N data inputs respectively coupled to data outputs of the N latch circuits, and a selection input, where the data multiplexer is configured to select a data input of the N data inputs of the data multiplexer to connect to the data output of the data multiplexer based on the selection input of the data multiplexer; a data path having a data input coupled to the data output of the data multiplexer; and a logic circuit having a data output, and a data input coupled to the data output of the data path, where the logic circuit is configured to latch data at the data input of the logic circuit when the output latch signal is asserted.

Example 21. The memory circuit of example 20, where the latch control circuit is configured to provide a selection signal to the selection input of the data multiplexer, and control a transition of the selection signal based on the assertion of the output latch signal.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A memory circuit comprising:
    a memory array configured to provide read data to a first data bus;
    N latch circuits coupled in parallel, wherein each latch circuit of the N latch circuits has data inputs coupled to the first data bus and is configured to store read data from the first data bus, and a latch input, wherein N is a positive integer greater than or equal to 2;
    a data multiplexer having a data output, N data inputs respectively coupled to data outputs of the N latch circuits, and a selection input, wherein the data multiplexer is configured to select a data input of the N data inputs of the data multiplexer to connect to the data output of the data multiplexer based on the selection input of the data multiplexer;
    a logic circuit having a data input and a data output;
    a data path coupled between the data output of the data multiplexer and the data input of the logic circuit, the data path configured to cause a propagation of data from the data output of the data multiplexer to the data input of the logic circuit;
    a read control circuit configured to, in response to a read command, assert a first read signal to cause the memory array to provide the read data to the first data bus, and after asserting the first read signal, assert a first latch signal; and
    a latch control circuit configured to provide a selection signal to the selection input of the data multiplexer, receive the first latch signal from the read control circuit, and provide a respective latching signal of a plurality of latching signals to the latch input of each latch circuit of the N latch circuits, wherein the latch control circuit is configured to assert the respective latching signal of the plurality of latching signals in response to the assertion of the first latch signal.

2. The memory circuit of claim 1, further comprising a controller configured to receive the read command and assert an output latch signal a time after reception of the read command, wherein the logic circuit is configured to latch data at the data input of the logic circuit when the output latch signal is asserted.

3. The memory circuit of claim 2, wherein the controller is configured to assert a read enable signal in response to receiving the read command, wherein the read control circuit is configured to assert the first read signal in response to the assertion of the read enable signal.

4. The memory circuit of claim 2, wherein the controller is configured to receive a clock signal, wherein the read command is synchronized with the clock signal, and wherein the controller is configured to assert the output latch signal a fixed number of clock pulses of the clock signal after reception of the read command.

5. The memory circuit of claim 2, wherein the latch control circuit is configured to control the selection signal based on the output latch signal.

6. The memory circuit of claim 5, wherein the latch control circuit is configured to cause a transition of the selection signal in a round robin manner when the output latch signal is asserted.

7. The memory circuit of claim 5, wherein the latch control circuit is configured to cause a transition of the selection signal to a next value selecting a next latch circuit of the N latch circuits a latest event between the assertion of the output latch signal and the assertion of a latching signal of the plurality of latching signals provided to the next latch circuit.

8. The memory circuit of claim 1, wherein N is equal to 2 so that the N latch circuits comprises first and second latch circuits, and wherein the latch control circuit is configured to alternate between asserting a first latching signal of the plurality of latching signals provided to the first latch circuit and asserting a second latching signal of the plurality of latching signals provided to the second latch circuit, in response to the assertion of the first latch signal.

9. The memory circuit of claim 1, wherein the read control circuit is configured to assert the first latch signal a fixed time after asserting the first read signal.

10. The memory circuit of claim 1, wherein N is equal to 4 so that the N latch circuits comprises first, second, third, and fourth latch circuits, and wherein the latch control circuit is configured to assert first, second, third, and fourth latching signals of the plurality of latching signals provided to the first, second, third, and fourth latch circuits, respectively, in a round robin manner, in response to assertions of the first latch signal.

11. The memory circuit of claim 1, wherein the memory array comprises flash memory.

12. The memory circuit of claim 1, wherein the first data bus comprises more than 100 data lines.

13. A method comprising:
    receiving a first read command;
    sensing first data from a memory array based on the first read command;
    providing the sensed first data to a first data bus;
    asserting a first latch signal a time after receiving the first read command;
    latching the sensed first data from the first data bus into one latch circuit of N latch circuits in response to the assertion of the first latch signal, wherein the N latch circuits are coupled in parallel, wherein each latch circuit of the N latch circuits has data inputs coupled to the first data bus, and wherein N is a positive integer greater than or equal to 2;
    causing an output of the one latch circuit to propagate to a data input of a logic circuit via a data path;
    asserting an output latch signal a first time after receiving the first read command to latch the sensed first data from the one latch circuit into the logic circuit;
    receiving a second read command;
    sensing second data from the memory array based on the second read command;
    selecting a next latch circuit from the N latch circuits;
    latching the sensed second data into the next latch circuit;
    causing an output of the next latch circuit to propagate to the data input of the logic circuit via the data path; and asserting the output latch signal a second time after receiving the second read command to latch the sensed second data from the next latch circuit into the logic circuit.

14. The method of claim 13, wherein selecting the next latch circuit from the N latch circuits comprises selecting the next latch circuit in a round robin manner.

15. The method of claim 13, further comprising receiving a clock signal, wherein the first read command is synchronized with the clock signal, wherein asserting the output latch signal comprises asserting the output latch signal a fixed number of clock pulses of the clock signal after receiving the first read command.

16. The method of claim 15, wherein a frequency of the clock signal is between 533 MHz to 820 MHz.

17. The method of claim 13, wherein selecting the next latch circuit from the N latch circuits comprises selecting the next latch circuit in response to a latest event between the assertion of the output latch signal and the latching of the sensed second data into the next latch circuit.

18. The method of claim 13, wherein asserting the first latch signal comprises asserting the first latch signal a fixed time after receiving the first read command.

19. A memory circuit comprising:
a memory array configured to provide read data to a first data bus;
a controller configured to receive a read command and a clock signal and assert an output latch signal a predetermined number of clock pulses of the clock signal after reception of the read command, the controller further configured to provide a memory address to the memory array based on the read command;
a read control circuit configured to, in response to the read command,
assert a first read signal to cause the memory array to provide read data to the first data bus based on the memory address, and,
a fixed time after asserting the first read signal, assert a first latch signal, wherein the fixed time is asynchronous with respect to the clock signal;
N latch circuits coupled in parallel, wherein each latch circuit of the N latch circuits has data inputs coupled to the first data bus, and a latch input, wherein N is a positive integer greater than or equal to 2;
a latch control circuit configured to receive the first latch signal from the read control circuit and provide a respective latching signal to the latch input of each latch circuit of the N latch circuits, wherein the latch control circuit is configured to cause the latching of data into one of the N latch circuits in response to the assertion of the first latch signal by asserting a respective output latch signals;
a data multiplexer having a data output, N data inputs respectively coupled to data outputs of the N latch circuits, and a selection input, wherein the data multiplexer is configured to select a data input of the N data inputs of the data multiplexer to connect to the data output of the data multiplexer based on the selection input of the data multiplexer;
a data path having a data input coupled to the data output of the data multiplexer; and
a logic circuit having a data output, and a data input coupled to the data output of the data path, wherein the logic circuit is configured to latch data at the data input of the logic circuit when the output latch signal is asserted.

20. The memory circuit of claim 19, wherein the latch control circuit is configured to provide a selection signal to the selection input of the data multiplexer, and control a transition of the selection signal based on the assertion of the output latch signal.

21. The memory circuit of claim 19, wherein the memory array comprises flash memory.

* * * * *